United States Patent [19]

Sugimoto

[11] Patent Number: 5,146,116
[45] Date of Patent: Sep. 8, 1992

[54] ECL CIRCUIT WITH A REDUCED POWER ACTIVE PULLDOWN

[75] Inventor: Yasuhiro Sugimoto, Yokohama, Japan

[73] Assignee: Kabushiki Kaisha Toshiba, Kanagawa, Japan

[21] Appl. No.: 619,981

[22] Filed: Nov. 30, 1990

[30] Foreign Application Priority Data

Nov. 30, 1989 [JP] Japan .................... 1-311335

[51] Int. Cl.⁵ .................................. H03K 17/04
[52] U.S. Cl. ............................. 307/455; 307/443; 307/475
[58] Field of Search ............ 307/455, 475, 443, 264, 307/456, 454, 300, 280

[56] References Cited

U.S. PATENT DOCUMENTS

| 4,539,493 | 9/1985 | Varadarajan | 307/455 |
|---|---|---|---|
| 4,577,125 | 3/1986 | Allen | 307/455 |
| 4,629,913 | 12/1986 | Lechner | 307/455 X |
| 4,680,480 | 7/1987 | Hopta | 307/455 X |
| 4,684,831 | 8/1987 | Kruest | 307/455 X |
| 4,687,953 | 8/1987 | Varadarajan | 307/455 X |
| 4,737,663 | 4/1988 | Varadarajan | 307/455 |
| 4,835,420 | 5/1989 | Rosky | 307/475 |
| 4,906,869 | 3/1990 | Masuoka | 307/455 |
| 4,926,065 | 5/1990 | Coy et al. | 307/455 X |
| 4,999,520 | 3/1991 | Usami et al. | 307/443 X |

FOREIGN PATENT DOCUMENTS 0177278 9/1986 European Pat. Off. .
0293833 7/1988 European Pat. Off. .

OTHER PUBLICATIONS

Toh et al., "A 23-ps/2.1 mW ECL Gate with an AC-Coupled Pull-Down Emmitter-Follower Stage", IEEE Journal of Solid State Circuits, vol. 24, No. 5, New York: Oct. 1989, pp. 1301-1306.

Primary Examiner—David Hudspeth
Attorney, Agent, or Firm—Banner, Birch McKie & Beckett

[57] ABSTRACT

In an ECL circuit comprising a differential type switching circuit having first and second output terminals, a first transistor connected to a first power source, a second transistor connected to a second power source, and a capacitor connected between the second output terminal of the switching circuit and the base of the second transistor, the ECL circuit further comprises a constant current source connected between the first power source and the base of the second transistor, and an impedance connected between the base of the second transistor and the second power source. In the above ECL circuit, the base of the second transistor is biased by means of a circuit constituted by the constant current source and the impedance and the static current flowing in the second transistor can be stably maintained by using a constant current source which can be easily obtained in the prior art as the above constant current source. Further, since the base potential of the second transistor can be determined by the second power source potential of the constant current source, the power consumption can be reduced by adequately setting the second power source potential. In addition, since the base impedance of the second transistor can be set to be higher than the base impedance of the transistor Q5 in the conventional circuit shown in FIG. 1, charges injected into the base of the second transistor via the capacitor may effectively function, causing the driving ability of the second transistor to be enhanced.

19 Claims, 5 Drawing Sheets

ECL CIRCUIT WITH A REDUCED POWER ACTIVE PULLDOWN

BACKGROUND OF THE INVENTION

1. Field of the Invention

This invention relates to an emitter coupled logic (ECL) circuit, and more particularly to reduction in the power consumption thereof.

2. Description of the Related Art

An ECL circuit (disclosed in "Nikkei Electronics" Feb. 6, 1989, No. 466. pp 211 to 218) shown in FIG. 1 is known as an example of the conventional ECL circuit. The ECL circuit includes a pull-up transistor Q7 constituting an emitter follower and a pull-down transistor Q5 having a capacitor Cc as a coupling capacitor.

Transistors Q1 and Q2 constitute a differential type switching circuit 12, and the base of the transistor Q2 is applied with a reference bias potential $V_T$ and the base of the transistor Q1 is applied with a potential of $(VT \pm 250)$ mV.

Assuming that the base of the transistor Q1 is raised to a high level potential of $(VT+250)$ mV, then the transistor Q1 is turned on and the transistor Q2 is turned off. When the transistor Q2 is turned off, the collector potential of the transistor Q2 is raised, causing a transistor Q7 to be turned on. As a result, the potential of an output 14 is set to a high level.

When the switching mode of the switching circuit 12 is inverted, that is, when the transistors Q1 and Q2 are respectively turned off and on, the collector potential of the transistor Q1 is raised. The raised collector potential is applied to the base of the transistor Q5 via the coupling capacitor Cc, thus turning on the transistor Q5. As a result, a discharging operation (indicated by an arrow 13) of stored charge on an output capacitor $C_L$ is caused via the transistor Q5, thereby setting the potential of the output 14 to a low level.

Addition of the pull-down transistor Q5 and pull-up transistor Q7 permits the pull-down operation and pull-up operation to be actively effected.

In the conventional circuit shown in FIG. 1, a transistor Q4 and a constant voltage source (not shown) for supplying a clamp voltage $V_{CLAMP}$ to clamp the base potential of the transistor Q4 are used as a bias potential supplying circuit for the transistor Q5.

In order to keep the static state of the transistor Q5 stable, it is necessary to prevent the static current flowing in the transistor Q5 from being influenced by temperature variation. To meet the requirement, compensation for variation in the clamp voltage $V_{CLAMP}$ with respect to temperature variation must be made and a corresponding device must be provided.

Further, since the transistor Q4 and a resistor R4 connected in series with the transistor Q4 are additionally provided, additional power consumption is caused by these elements and this is not preferable from the viewpoint of reduction in the power consumption.

Further, it is difficult to stably effect the temperature compensation for the $V_{CLAMP}$ voltage at a level (approx. $\pm 0.5$ V) near the ground (GND) potential level. For example, in a case where a power source $V_E$ is set at approx. $-2$ V which is normally required to reduce the power consumption, sufficient compensation for variation in $V_{CLAMP}$ with respect to temperature variation cannot be attained and thus it becomes difficult to stably maintain the current flowing in the transistor Q5.

SUMMARY OF THE INVENTION

This invention has been made in view of the above problems, and an object of this invention is to provide an ECL circuit in which a static current flowing in the pull-down transistor can be stably maintained and the power consumption can be reduced.

According to one aspect of this invention, there is provided am ECL circuit comprising an output terminal of a whole circuit; a differential type switching circuit having first and second output terminals; a first transistor having a base connected to the first output terminal of the switching circuit, a collector connected to a first power source and an emitter connected to the output terminal of the whole circuit; a second transistor having a collector connected to the output terminal of the whole circuit and an emitter connected to a second power source; a capacitor connected between the second output terminal of the switching circuit and the base of the second transistor; a constant current source connected between the first power source and the base of the second transistor; and an impedance connected between the base of the second transistor and the second power source.

In the above ECL circuit, the base of the second transistor (pull-down transistor) is biased by means of a circuit constituted by the constant current source and the impedance and the static current flowing in the second transistor can be stably maintained by using a constant current source which can be easily obtained in the prior art as the above constant current source.

Further, since the base potential of the second transistor can be determined by the second power source potential of the constant current source, the power consumption can be reduced by adequately setting the second power source potential.

In addition, since the base impedance of the second transistor can be set to be higher than the base impedance of the transistor Q5 in the conventional circuit shown in FIG. 1, charges injected into the base of the second transistor via the capacitor may effectively function, causing the driving ability of the second transistor to be enhanced.

Additional objects and advantages of the invention will be set forth in the description which follows, and in part will be obvious from the description, or may be learned by practice of the invention. The objects and advantages of the invention may be realized and obtained by means of the instrumentalities and combination particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

There will now be described an embodiment of this invention with reference to the accompanying drawings.

Figure 1:
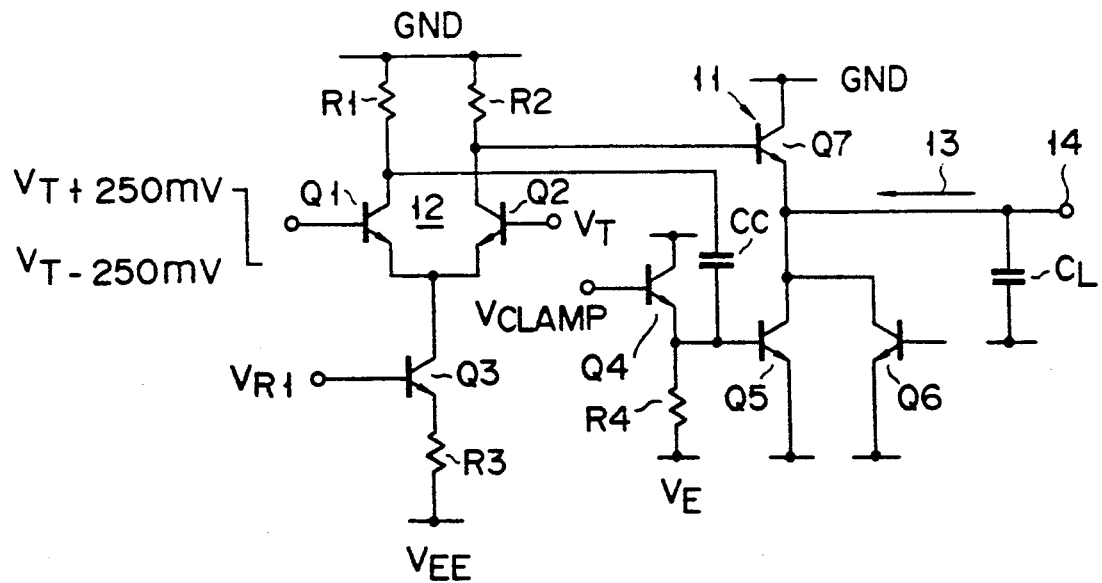
FIG. 1 is a diagram showing the conventional ECL circuit.
Figure 2:
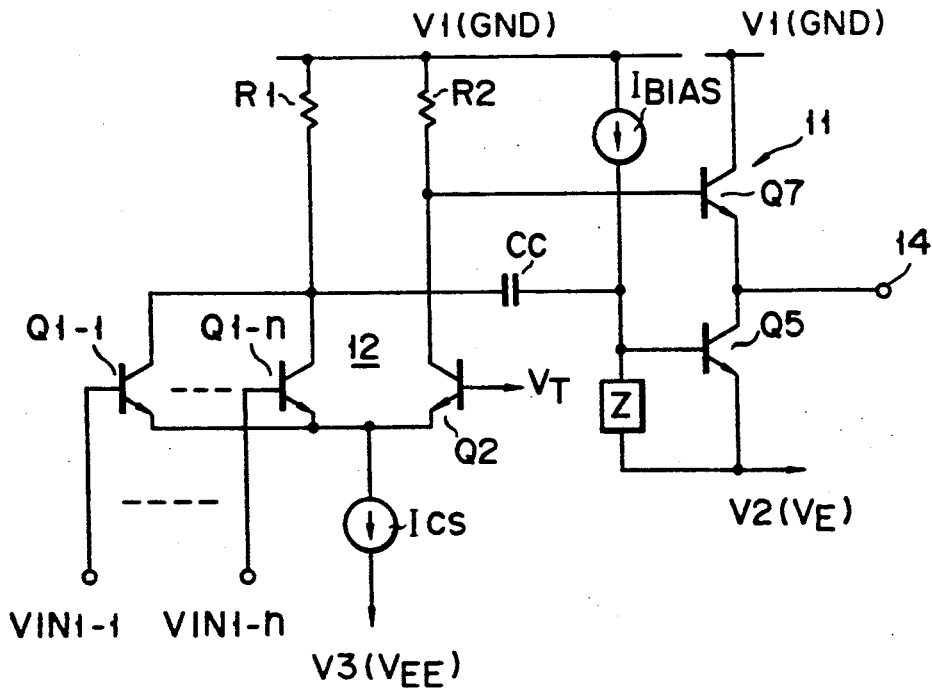
FIG. 2 is a diagram showing an embodiment of an ECL circuit according to this invention.

FIG. 2 shows an ECL circuit according to a first embodiment of this invention. Portions which are the same as those in FIG. 1 are denoted by the same reference numerals.

A feature of the first embodiment is the base of a pull-down transistor Q5 is connected to a connection node between a constant current source $I_{BIAS}$ and an impedance Z and the other ends of the constant current source $I_{BIAS}$ and the impedance Z are respectively connected to a power source V1 (GND) and a power source V2 ($V_E$).

Transistors $Q_{1-1}$, ---, and $Q_{1-n}$ and Q2 are connected to constitute a switching circuit 12 and the emitters of the respective transistors are connected to one another and connected to a power source V3 ($V_{EE}$) via a current source $I_{CS}$. The collectors of the transistors $Q_{1-1}$, ---, and $Q_{1-n}$ are connected to one another and connected to the power source V1 (GND) via a resistor R1. The collector of the transistor Q2 is connected to a power source V1 via a resistor R2. The bases of the transistors $Q_{1-1}$, ---, and $Q_{1-n}$ are respectively supplied with inputs $VIN_{1-1}$, ---, and $VIN_{1-n}$. The base of the transistor Q2 is applied with a bias power source voltage $V_T$.

A pull-up transistor Q7 and a pull-down transistor Q5 are serially connected between the power sources V1 and V2. The base of the transistor Q7 is connected to the collector of the transistor Q2 and the base of the transistor Q5 is connected to a connection node between the constant current source $I_{BIAS}$ and the impedance Z. 1 The collectors of the transistors $Q_{1-1}$ to $Q_{1-n}$ are connected to a connection node between constant current source $I_{BIAS}$ and impedance 2 via a coupling capacitor Cc. An output 14 is connected to the connection node between the transistors Q7 and Q5.

Assume now that the input $VIN_{1-1}$ is set to a high potential level and the transistors $Q_{1-1}$ and Q2 are respectively turned on and off. Turn-off of the transistor Q2 causes the collector potential of the transistor Q2 to rise, thereby causing the pull-up transistor Q7 to be turned on. As a result, the potential of the output 14 is raised to a high level V1 (GND).

When all of the inputs $VIN_{1-1}$ to $VIN_{1-n}$ are set at a low level, all of the transistors $Q_{1-1}$ to $Q_{1-n}$ are set in the OFF state and the transistor Q2 is set in the ON state. Turn-off of the transistors $Q_{1-1}$ to $Q_{1-n}$ causes the collector potentials of the transistors $Q_{1-1}$ to $Q_{1-n}$ to rise. The thus raised collector potential is input to the base of the pull-down transistor Q5 via the coupling capacitor Cc, thereby causing the transistor Q5 to be turned on. As a result, the output potential is set to a low level V2 ($V_E$).

In the ECL circuit of FIG. 2, the base of the transistor Q5 is biased by means of the constant current source $I_{BIAS}$ and the impedance Z. Since a constant current source which is temperature-compensated can be easily obtained in the prior art and can be used as the constant current source $I_{BIAS}$, the static current in the transistor Q5 can be kept stable.

The base potential of the transistor Q5 is set at "V2+$V_{BE}$ ($V_{BE} \approx 0.7$ V)" and determined by V2 since $V_{BE}$ is fixed. V2 can be freely set and can be set at an optimum level (normally, at $-2$ V) to attain a low power consumption. Further, the current value of the constant current source $I_{BIAS}$ can be freely set and therefore the power consumption can be reduced by setting the current value to a small value.

Figure 3:
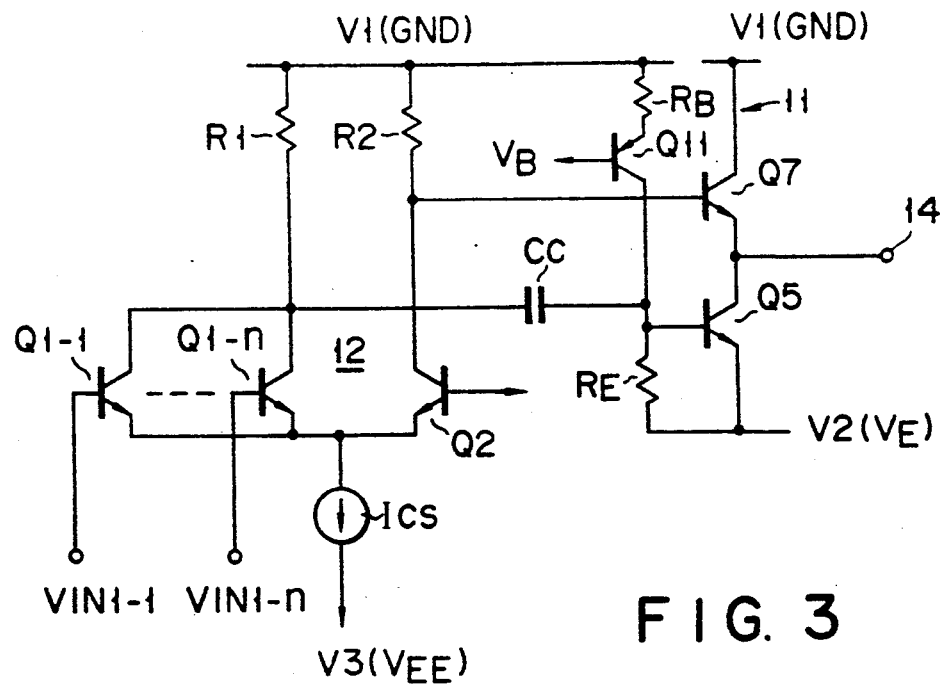
FIG. 3 is a circuit diagram showing the concrete construction of the ECL circuit of FIG. 2, and more particularly the concrete construction of the constant current source IBIAS and impedance Z.

FIG. 3 concretely shows the circuit of FIG. 1, and the circuit includes a series circuit of a transistor Q11 and a resistor $R_B$ as the constant current source $I_{BIAS}$. A bias voltage $V_B$ is applied to the base of the transistor Q11. Further, a resistor $R_E$ is used as the impedance Z. The operation of the whole circuit is the same as that described with reference to FIG. 2 and the explanation therefor is omitted.

Figure 4:
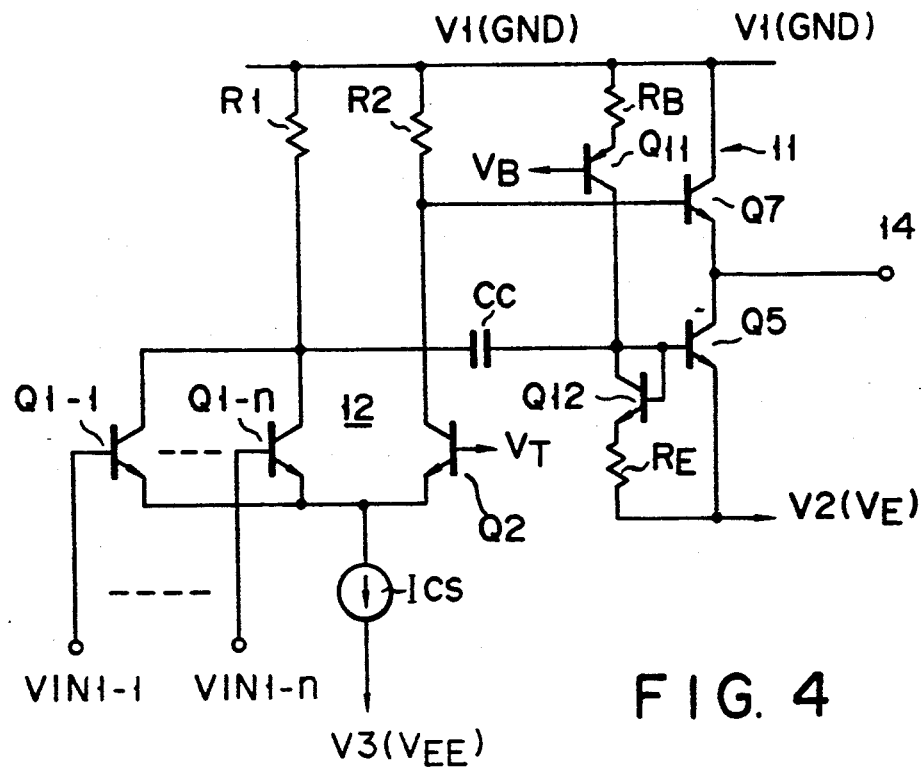
FIG. 4 is a circuit diagram showing another concrete construction of the ECL circuit of FIG. 2.

FIG. 4 concretely shows the circuit of FIG. 1, and the circuit includes a series circuit of a transistor Q12 and a resistor $R_E$ as the impedance Z. The transistor Q12 is connected as a diode and the connection node thereof is connected to the base of the transistor Q5. With this construction, the resistance of the resistor $R_E$ can be made small. In this case, the construction of the constant current source $I_{BIAS}$ is the same as that shown in FIG. 3. The operation of the whole circuit is the same as that described with reference to FIG. 2 and the explanation therefor is omitted.

Figure 5:
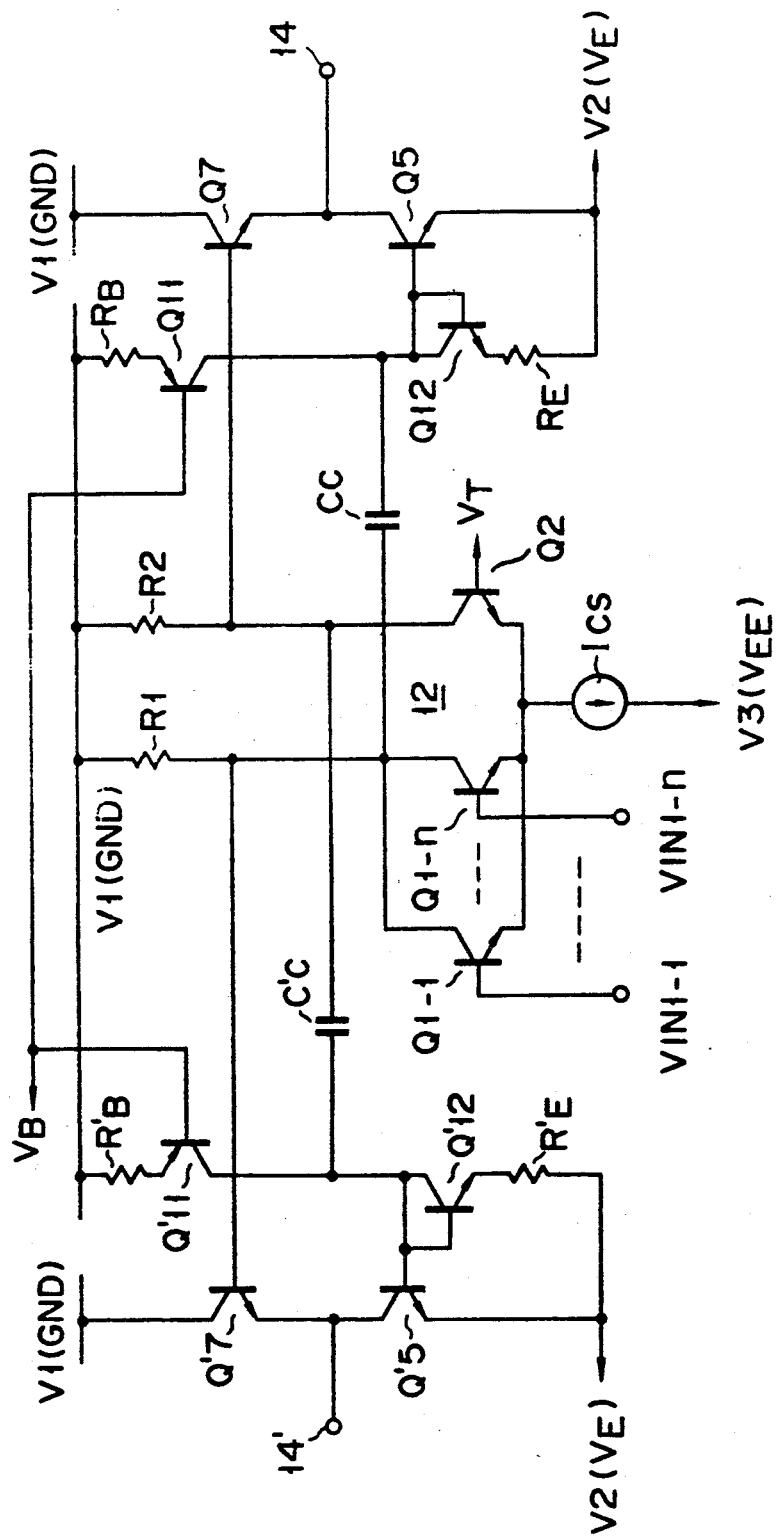
FIG. 5 is a circuit diagram showing an ECL circuit which is a modification of the ECL circuit of FIG. 3 and has an additional output series.

FIG. 5 shows a circuit which is obtained by modifying the circuit of FIG. 4 to attain a complementar output.

The circuit is constituted by providing an additional output section in the circuit of FIG. 4. That is, in the circuit of FIG. 4, the output section is constituted by the transistors Q5, Q7 Q11 and Q12 and the resistors $R_B$ and $R_E$, and in the circuit of FIG. 5, an output section of the same construction is additionally provided. In this case, the output section in the circuit of FIG. 4 is connected to the collectors of the transistors $Q_{1-1}$ to $Q_{1-n}$ of the differential type switching circuit 12 via the coupling capacitor Cc, but the additional output section is connected to the collector of the transistor Q2 of the differential type switching circuit 12 via a coupling capacitor Cc'. Elements constituting the additional output section are denoted by numerals which are obtained by attaching "'" to the designators used for denoting the elements constituting the output section of FIG. 4.

In the output section in the circuit of FIG. 4, the base of the transistor Q7 is connected to the collector of the transistor Q2, but in the additional output section, the base of the transistor Q7' is connected to the collectors of the transistors $Q_{1-1}$ to $Q_{1-n}$.

In this modification, since the output sections of the same construction are connected to the complementary outputs (the collectors of the transistors $Q_{1-1}$ to $Q_{1-n}$ and the collector of the transistor Q2) of the differential type switching circuit 12 which operates in a complementary fashion, outputs of inverted levels can be derived from the respective output sections and thus a complementary output can be obtained as an output of the whole circuit.

The operation of the additional output section is the same as that of the output section in the circuit of FIG. 4 and the explanation therefor is omitted.

Since the impedance of the base of the transistor Q5 in the circuit of the embodiment of FIG. 4 can be set relatively higher than the impedance of the base of the transistor Q5 in the conventional circuit of FIG. 1, charges injected into the transistor Q5 via the coupling capacitor Cc can be effectively function to enhance the driving ability of the transistor Q5.

Further, since the transistor Q5 is biased by use of the constant current source $I_{BIAS}$ including the transistor Q11, the output level of the power source V2 can be freely set and a desired value of V2 = −2 V can be set.

Assuming that the static current $I_{Q12}$ in the transistor Q12 is 40 µA and the static current $I_{Q5}$ in the transistor Q5 is 60 µA, then the power consumption in the output circuit becomes $V2 \times (I_{Q12} + I_{Q5}) = 0.2$ mW.

Figure 6:
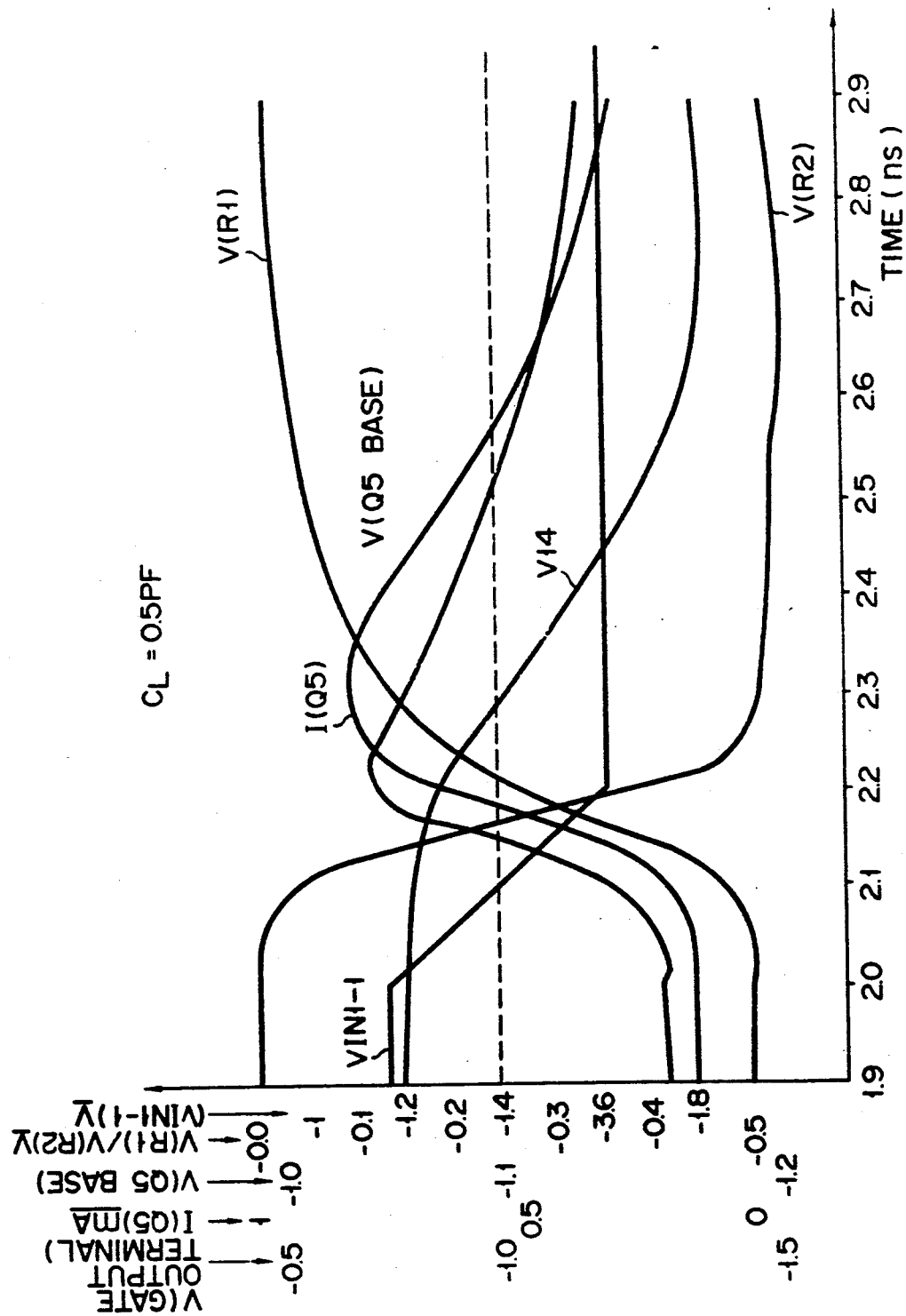
FIG. 6 is a waveform diagram showing voltages and currents in respective points of the ECL circuit of FIG. 3.

FIG. 6 shows the waveforms of voltages and currents on various points in the circuit of FIG. 4. In FIG. 6, the abscissa indicates time and the ordinate indicates the voltage and current. In FIG. 6, V14 indicates the voltage of the circuit output terminal 14, $V_{Q5base}$ indicates the base voltage of the transistor Q5, and $V_{R1}$ and $V_{R2}$ indicate voltages caused across the resistors R1 and R2. As is clearly seen from FIG. 6, when the level of the input voltage $VIN_{1-1}$ varies, the current $I_{Q5}$ of the transistor Q5 significantly increases. As a result, the current value of the transistor Q5 can be set small to suppress the power consumption in the static condition of the transistor Q5 while the driving ability of the transistor Q5 can be enhanced in the driving mode.

Figure 7:
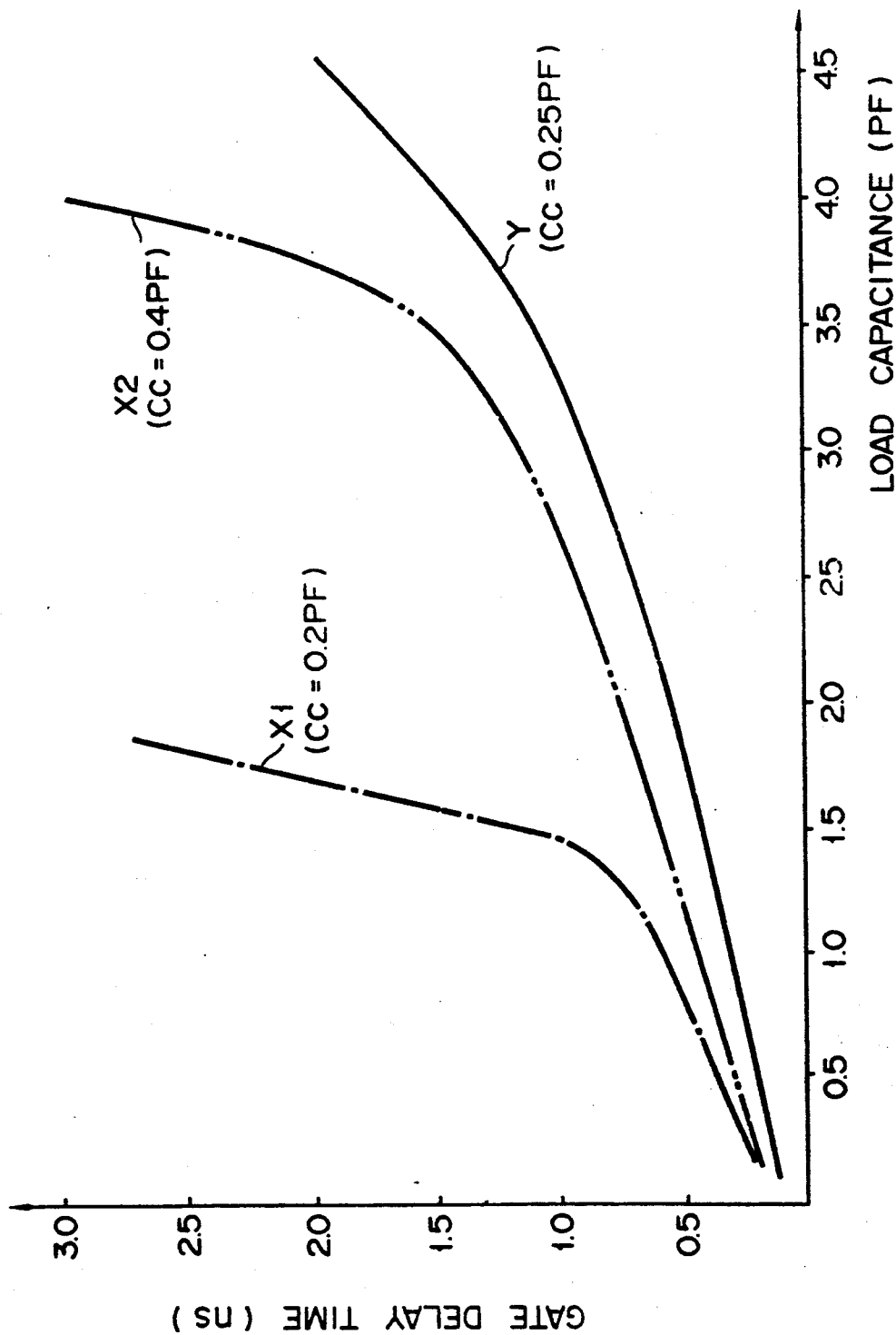
FIG. 7 is a diagram showing variation in time with respect to variation in a load capacitance provided in the conventional ECL circuit of FIG. 1 and a load capacitance-delay time characteristic curve showing variation in the delay time in the ECL circuit of FIG. 3.

FIG. 7 shows the delay time characteristic of the circuit of FIG. 4 of this invention with respect to the load capacitance and that of the conventional circuit of FIG. 1. In FIG. 7, curves XI and XII indicate the characteristics of the conventional circuit of FIG. 1 obtained when the coupling capacitor Cc is set to have a capacitance of 0.2 pF and 0.4 pF, and a curve Y indicates a characteristic of the circuit of this invention shown in FIG. 4 obtained when the coupling capacitor Cc is set to have a capacitance of 0.25 pF. As is clearly seen from FIG. 7, in the conventional circuit, the delay time rapidly increases as indicated by the curve XI if the load capacitance becomes larger than 1.5 pF in a case where Cc is set at 0.2 pF and and increases as indicated by the curve XII if the load capacitance becomes larger than 3.5 pF in a case where Cc is set at 0.4 pF and.

In contrast, in the circuit of this invention, the delay time will not significantly increase as indicated by the curve B even if the load capacitance becomes larger than 4.0 pF. As a result, a high-speed operation can be obtained in a wide load capacitance range.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. An ECL circuit comprising;
an output terminal of a whole circuit;
a differential type switching circuit having first and second output terminals;
a first transistor having a base connected to the first output terminal of said switching circuit, a collector connected to a first power source and an emitter connected to said output terminal of the whole circuit;
a second transistor having a collector connected to said output terminal of the whole circuit and an emitter connected to a second power source;
a capacitor connected between said second output terminal of said switching circuit and the base of said second transistor;
a constant current source directly connected between said first power source and the base of said second transistor; and
an impedance directly connected between the base of said second transistor and said second power source.

2. An ECL circuit according to claim 1, wherein said current source includes a PNP transistor having a collector-emitter path connected between said first power source and the base of said second transistor.

3. An ECL circuit according to claim 2, wherein said current source further includes a resistor connected in series with the emitter-collector path of said PNP transistor.

4. An ECL circuit according to claim 1, wherein said impedance includes a series circuit of a resistor and a diode connected between the base of said second transistor and said second power source.

5. An ECL circuit according to claim 1, wherein said impedance includes a resistor connected between the base of said second transistor and said second power source.

6. An ECL circuit according to claim 1, further comprising:
an additional output terminal of said whole circuit;
a third transistor having a base connected to the second output terminal of said switching circuit, a collector connected to said first power source and an emitter connected to said additional output terminal;
a fourth transistor having a collector connected to said additional output terminal and an emitter connected to said second power source;
an additional current source connected between said first power source and the base of said fourth transistor;
an additional capacitor connected between the first output terminal of said switching circuit and the base of said fourth transistor; and
an impedance connected between the base of said fourth transistor and said second power source.

7. An ECL circuit according to claim 6, wherein said additional constant current source includes a PNP transistor having an emitter-collector path connected between said first power source and the base of said fourth transistor.

8. An ECL circuit according to claim 7, wherein said additional constant current source further includes a resistor connected in series with the emitter-collector path of said PNP transistor.

9. An ECL circuit according to claim 6, wherein said additional impedance includes a series circuit of a resistor and a diode connected between the base of said fourth transistor and said second power source.

10. An output circuit for use with an ECL circuit comprising:
a first power source node;

a second power source node;
a first output node;
a first transistor having a collector coupled to the first power source node, an emitter coupled to the first output node, and a base coupled to the ECL circuit;
a second transistor having a collector coupled to the first output node, an emitter coupled to the second power source node, and a base;
a first constant current source directly connected between the first power source node and the base of the second transistor; and
a first impedance directly connected between the base of the second transistor and the second power source node.

11. An output circuit according to claim 10, wherein the first constant current source includes a PNP transistor having an emitter coupled to the first power source node, a collector coupled to the base of the second transistor, and a base coupled to a first reference voltage.

12. An output circuit according to claim 11, wherein the first constant current source further includes a first resistor coupled between the emitter of the PNP transistor and the first power source node.

13. An output circuit according to claim 10, wherein the first impedance includes a first series circuit of a second resistor and a first diode, the first series circuit coupled between the base of the second transistor and the second power source node.

14. An output circuit according to claim 10, wherein the first impedance includes a third resistor coupled between the base of the second transistor and the second power source node.

15. An output circuit according to claim 10, further comprising:
a second output node;
a third transistor having a collector coupled to the first power source node, an emitter coupled to the second output node, and a base coupled to the ECL circuit;
a fourth transistor having a collector coupled to the second output node, an emitter coupled to the second power source node, and a base;
a second constant current source coupled between the first power source node and the base of the fourth transistor; and
a second impedance coupled between the base of the fourth transistor and the second power source node.

16. An output circuit according to claim 15, wherein the second constant current source includes a PNP transistor having an emitter coupled to the first power source node, a collector coupled to the base of the fourth transistor, and a base coupled to a second reference voltage.

17. An output circuit according to claim 16, wherein the second constant current source further includes a third resistor coupled between the emitter of the third transistor and the first power source node.

18. An output circuit according to claim 17, wherein the second impedance includes a second series circuit of a fourth resistor and a second diode, the second series circuit coupled between the base of the fourth transistor and the second power source node.

19. An output circuit according to claim 16, wherein the second reference voltage equals the first reference voltage.

* * * * *